United States Patent
Huang et al.

(10) Patent No.: US 12,396,116 B2
(45) Date of Patent: Aug. 19, 2025

(54) ELECTRONIC DEVICE

(71) Applicant: InnoLux Corporation, Miao-Li County (TW)

(72) Inventors: Ming-Che Huang, Miao-Li County (TW); Tzu-Yuan Lin, Miao-Li County (TW); Chi-Chau Lin, Miao-Li County (TW)

(73) Assignee: INNOLUX CORPORATION, Maio-Li County (TW)

( * ) Notice: Subject to any disclaimer, the term of this patent is extended or adjusted under 35 U.S.C. 154(b) by 247 days.

(21) Appl. No.: 18/109,496

(22) Filed: Feb. 14, 2023

(65) Prior Publication Data
US 2023/0292457 A1 Sep. 14, 2023

(30) Foreign Application Priority Data
Mar. 14, 2022 (CN) .......................... 202220540936.3

(51) Int. Cl.
*H05K 5/06* (2006.01)
*H05K 5/02* (2006.01)

(52) U.S. Cl.
CPC ........... *H05K 5/069* (2013.01); *H05K 5/0247* (2013.01)

(58) Field of Classification Search
CPC ........ H05K 5/069; H05K 5/06; H05K 5/0247; H02B 1/26; H02B 1/28; H02B 1/305
See application file for complete search history.

(56) References Cited

U.S. PATENT DOCUMENTS

| | | | | |
|---|---|---|---|---|
| 6,259,033 | B1* | 7/2001 | Kassulat | H02G 3/088 |
| | | | | 174/151 |
| 6,706,969 | B1* | 3/2004 | Young | H02G 3/30 |
| | | | | 174/99 R |
| 9,496,641 | B2* | 11/2016 | Watanabe | H05K 5/0247 |
| 9,570,898 | B2* | 2/2017 | Suzuki | H01R 13/52 |
| 11,092,261 | B2* | 8/2021 | Bickert | F16L 3/2235 |
| 11,602,065 | B1* | 3/2023 | Hsiao | H05K 5/0247 |
| 2008/0105452 | A1* | 5/2008 | King | H02G 15/007 |
| | | | | 174/92 |
| 2019/0373751 | A1* | 12/2019 | Chiang | H05K 5/0247 |
| 2020/0220300 | A1* | 7/2020 | Wattenhofer | H02G 3/14 |
| 2022/0115845 | A1* | 4/2022 | Chang | H02B 1/305 |

FOREIGN PATENT DOCUMENTS

| | | |
|---|---|---|
| CN | 202678614 U | 1/2013 |
| TW | 200929723 A | 7/2009 |
| TW | 201340821 A | 10/2013 |

* cited by examiner

*Primary Examiner* — Nidhi Thaker
(74) *Attorney, Agent, or Firm* — MUNCY, GEISSLER, OLDS & LOWE, P.C.

(57) ABSTRACT

An electronic device includes a housing, a first protrusion portion and a first covering member. The housing has a bottom portion. The first protrusion portion is arranged on the bottom portion of the housing, wherein the first protrusion portion has a first groove through which a first wire passes. The first covering member detachably covers the first protrusion portion, wherein the first covering member has a first opening. In a first position, the first opening of the first covering member is used for allowing the first wire to pass through.

18 Claims, 8 Drawing Sheets

FIG. 8B ized mean that the difference between two values is within 10% of the average value of a given value. For example, terms such as "about", "approximately" and "substantially" can mean within 10% of a given value or range, or within 5%, 4%, 3%, 2%, 1% or 0.5% of a given value or range.

ELECTRONIC DEVICE

CROSS-REFERENCE TO RELATED APPLICATIONS

This application claims the benefits of the Chinese Patent Application Serial Number 202220540936.3, filed on Mar. 14, 2022, the subject matter of which is incorporated herein by reference.

BACKGROUND

Field

The present disclosure provides an electronic device, especially an electronic device with a waterproof design.

Description of Related Art

In response to climate and environmental conditions, most of the current outdoor electronic devices are equipped with protection units, such as waterproof structures, at the wire outlets to protect the internal circuits and components of the electronic devices from damage caused by water droplets, dust, etc.

However, most of the current waterproof designs involve the use of waterproof gaskets that are prone to aging and other problems with the increase of use time and, when the waterproof gaskets are partially damaged, the entire set needs to be replaced, resulting in increased costs.

Therefore, it is desired to improve the waterproof design of electronic devices so as to mitigate and/or obviate the existing defects.

SUMMARY

The present disclosure provides an electronic device, which includes: a housing having a bottom portion; a first protrusion portion arranged on the bottom portion of the housing, wherein the first protrusion portion has a first groove through which a first wire passes; and a first covering member for detachably covering the first protrusion portion, wherein the first covering member has a first opening. In a first position, the first opening of the first covering member is used for allowing the first wire to pass through.

Other novel features of the disclosure will become more apparent from the following detailed description when taken in conjunction with the accompanying drawings.

DETAILED DESCRIPTION OF EMBODIMENT

Reference will now be made in detail to exemplary embodiments of the present disclosure, examples of which are illustrated in the accompanying drawings. Wherever possible, the same reference numerals are used in the drawings and description to refer to the same or like parts.

Throughout the specification and the appended claims, certain terms may be used to refer to specific components. Those skilled in the art will understand that electronic device manufacturers may refer to the same components by different names. The present disclosure does not intend to distinguish between components that have the same function but have different names. In the following description and claims, words such as "containing" and "comprising" are open-ended words, and should be interpreted as meaning "including but not limited to . . . ".

Directional terms mentioned in the specification, such as "up", "down", "front", "rear", "left", "right", etc., only refer to the directions of the drawings. Accordingly, the directional term used is illustrative, not limiting, of the present disclosure. In the drawings, various figures illustrate the general characteristics of methods, structures and/or materials used in particular embodiments. However, these drawings should not be construed to define or limit the scope or nature encompassed by these embodiments. For example, the relative sizes, thicknesses and positions of various layers, regions and/or structures may be reduced or enlarged for clarity.

One structure (or layer, component, substrate) described in the present disclosure is disposed on/above another structure (or layer, component, substrate), which can mean that the two structures are adjacent and directly connected, or can refer to two structures that are adjacent rather than directly connected. Indirect connection means that there is at least one intermediate structure (or intermediate layer, intermediate component, intermediate substrate, intermediate space) between the two structures, the lower surface of one structure is adjacent to or directly connected to the upper surface of the intermediate structure, and the upper surface of the other structure is adjacent to or directly connected to the lower surface of the intermediate structure. The intermediate structure may be a single-layer or multi-layer physical structure or a non-physical structure, which is not limited. In the present disclosure, when a certain structure is arranged "on" other structures, it may mean that a certain structure is "directly" on other structures, or it means that a certain structure is "indirectly" on other structures; that is, at least one structure is sandwiched, in between a certain structure and other structures.

The terms, such as "about", "equal to", "equal" or "same", "substantially", or "substantially", are generally interpreted as within 20% of a given value or range, or as within 10%, 5%, 3%, 2%, 1%, or 0.5% of a given value or range.

In the specification and claims, unless otherwise specified, ordinal numbers, such as "first" and "second", used herein are intended to distinguish elements rather than disclose explicitly or implicitly that names of the elements bear the wording of the ordinal numbers. The ordinal numbers do not imply what order an element and another element are in terms of space, time or steps of a manufacturing method. Thus, what is referred to as a "first element" in the specification may be referred to as a "second element" in the claims.

It is noted that the following are exemplary embodiments of the present disclosure, but the present disclosure is not limited thereto, while a feature of some embodiments can be applied to other embodiments through suitable modification, substitution, combination, or separation. In addition, the present disclosure can be combined with other known structures to form further embodiments.

Unless otherwise defined, all terms (including technical and scientific terms) used herein have the same meaning as commonly understood by those skilled in the art related to the present disclosure. It can be understood that these terms, such as those defined in commonly used dictionaries, should be interpreted as having meaning consistent with the relevant technology and the background or context of the present disclosure, and should not be interpreted in an idealized or excessively formal way, unless there is a special definition in the embodiment of the present disclosure.

Figure 1:
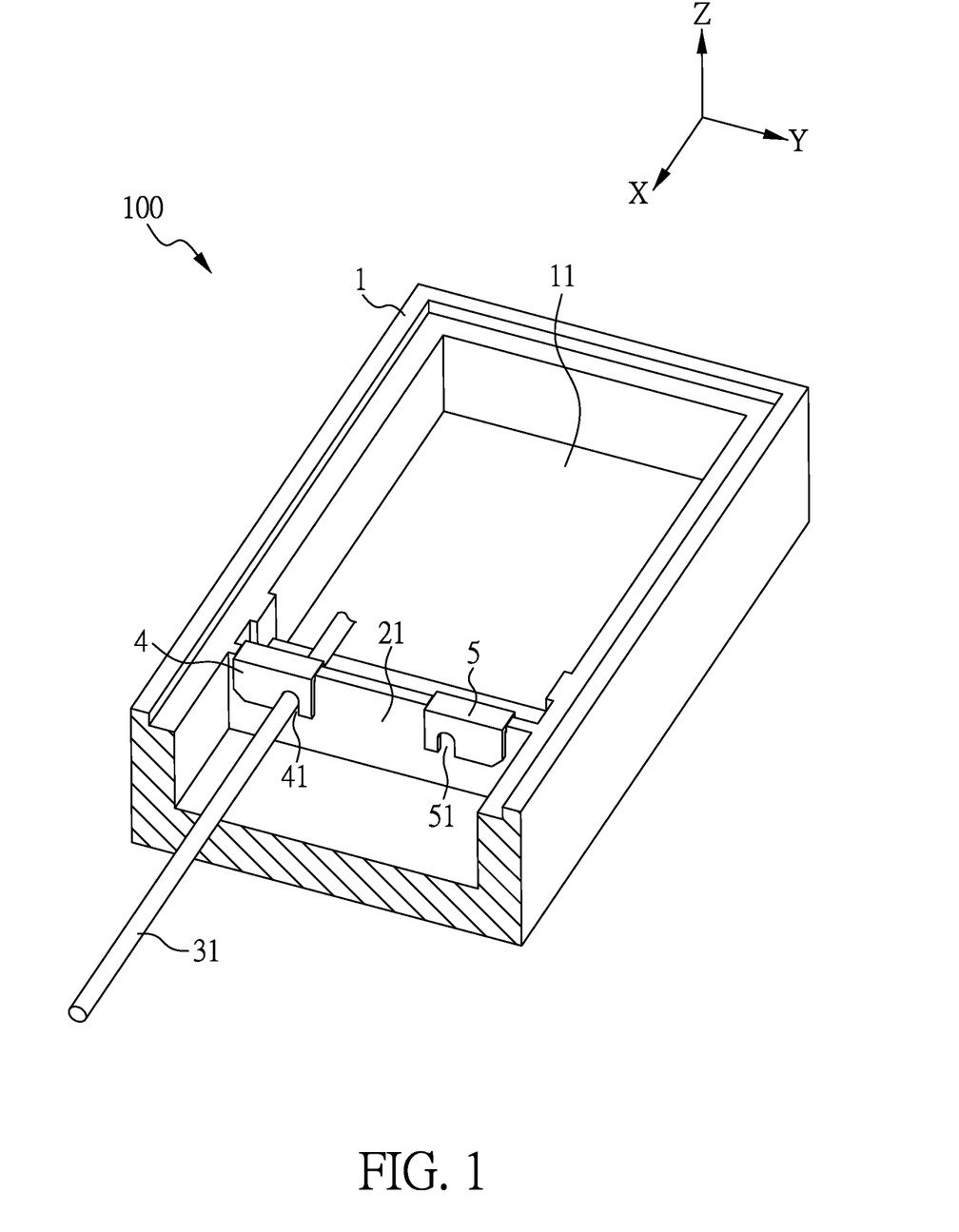
FIG. 1 is a three-dimensional schematic diagram of part of an electronic device according to an embodiment of the present disclosure.
Figure 2:
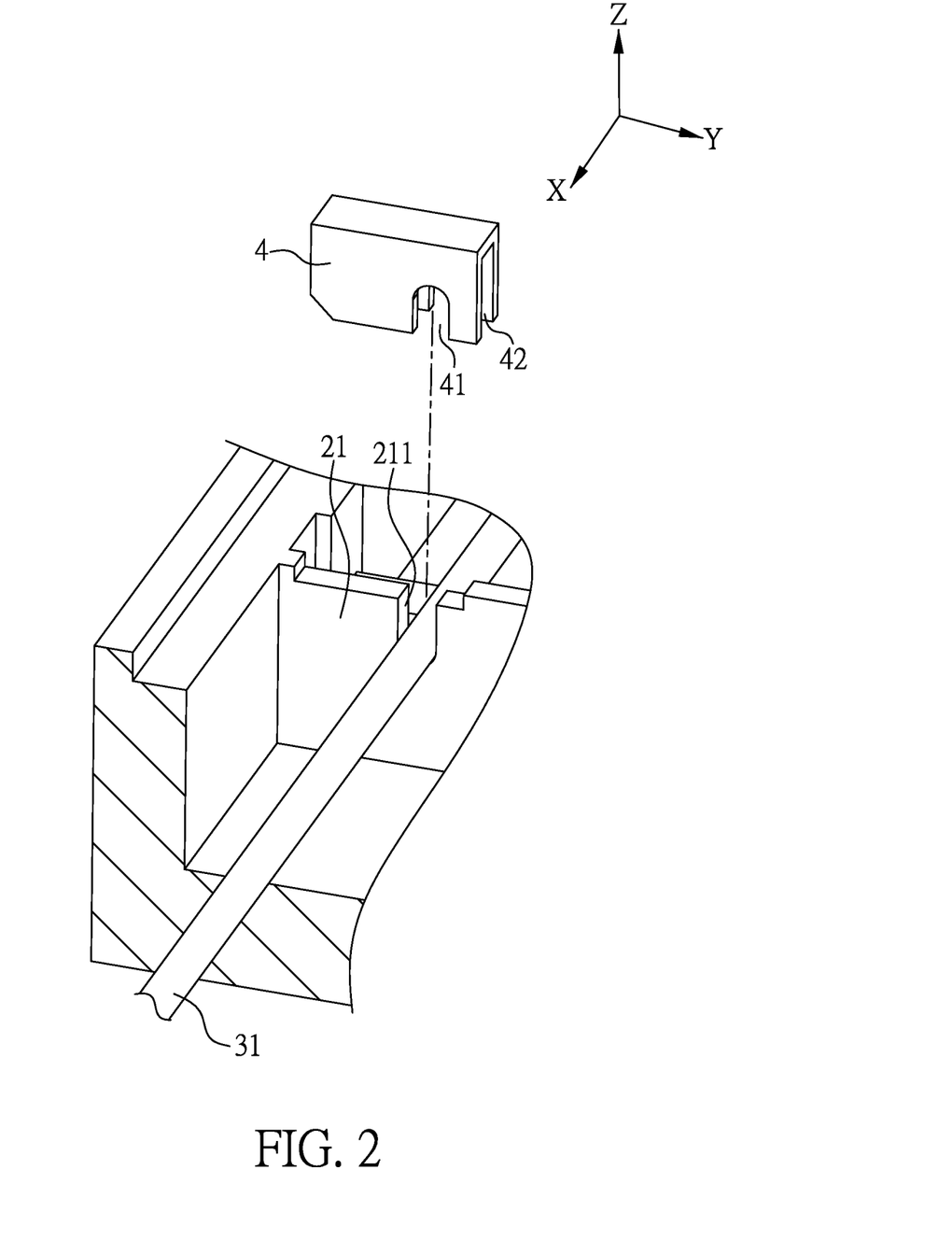
FIG. 2 is a schematic diagram of the first covering member in the wire passing orientation according to an embodiment of the present disclosure.

FIG. 1 is a three-dimensional schematic diagram of part of an electronic device according to an embodiment of the present disclosure. FIG. 2 is a schematic diagram of the first covering member in the first position, such as the wire passing orientation, according to an embodiment of the present disclosure.

As shown in FIG. 1 and FIG. 2, the electronic device 100 of the present disclosure includes: a housing 1 having a bottom portion 11; a first protrusion portion 21 disposed on the bottom portion 11 of the housing 1, wherein the first protrusion portion 21 has a first groove 211, and the first groove 211 is used for allowing a first wire 31 to pass through; and a first covering member 4 for detachably covering the first protrusion portion 21, wherein the first covering member 4 has a first opening 41. In a first position, the first opening 41 of the first covering member 4 is used for allowing the first wire 31 to pass through. In the present disclosure, although not shown in the figures, one end of the first wire 31 may be electrically connected to a power source or signal source, and the other end thereof may be electrically connected to internal components of the electronic device (such as a circuit board, etc.). In the present disclosure, with the arrangement of the first protrusion portion 21 and the first covering member 4, it is able to achieve the effect of protecting the internal circuits or components of the electronic device from being damaged by water droplets or dust.

In the present disclosure, as shown in FIG. 2, the first covering member 4 further has a first recess portion 42, and the first covering member 4 may cover the first protrusion portion 21 through the first recess portion 42, so as to assemble the first covering member 4 onto the first protrusion portion 21. The first covering member 4 is detachable, and may be provided with a first position and a second position. For example, the first position may be a wire passing orientation; that is, in the first position, the first opening 41 of the first covering member 4 is in communication with the first groove 211 of the first protrusion portion 21, and a wire (for example, the first wire 31) may pass through the first opening 41 of the first covering member 4. The second position may be a wire blocking orientation; that is, in the second position, the first opening 41 of the first covering member 4 is not in communication with the first groove 211 of the first protrusion portion 21, and no wire may pass through the first opening 41 of the first covering member 4. In addition, the first wire 31 may be fixed in the first groove 211 of the first protrusion portion 21 through the first covering member 4. With the arrangement of the first protrusion portion 21 and the first covering member 4, it is able to prevent water droplets or dust from entering the electronic device through the first groove 211 of the first protrusion portion 21, thereby reducing the risk of damage to the electronic device.

According to some embodiments, as shown in FIG. 1, the electronic device 100 further includes a first wire 31 that may pass through the first groove 211 of the first protrusion portion 21 and the first opening 41 of the first covering member 4. In addition, as shown in FIG. 2, the extending direction of the first opening 41 of the first covering member 4 may be the same as the extending direction X of the first wire 31. In other words, the extending direction of the first opening 41 of the first covering member 4 may be parallel to the extending direction X of the first wire 31. More specifically, in parallel to the extending direction X of the first wire 31, the first opening 41 of the first covering member 4 may penetrate the first covering member 4. Therefore, when the first covering member 4 is in the wire passing orientation, the first wire 31 may pass through the first opening 41 of the first covering member 4. In addition, in the present disclosure, the first opening 41 is a non-closed opening, and thus, as shown in FIG. 1, the opening direction of the first opening 41 faces the bottom portion 11 of the housing 1.

Figure 3:
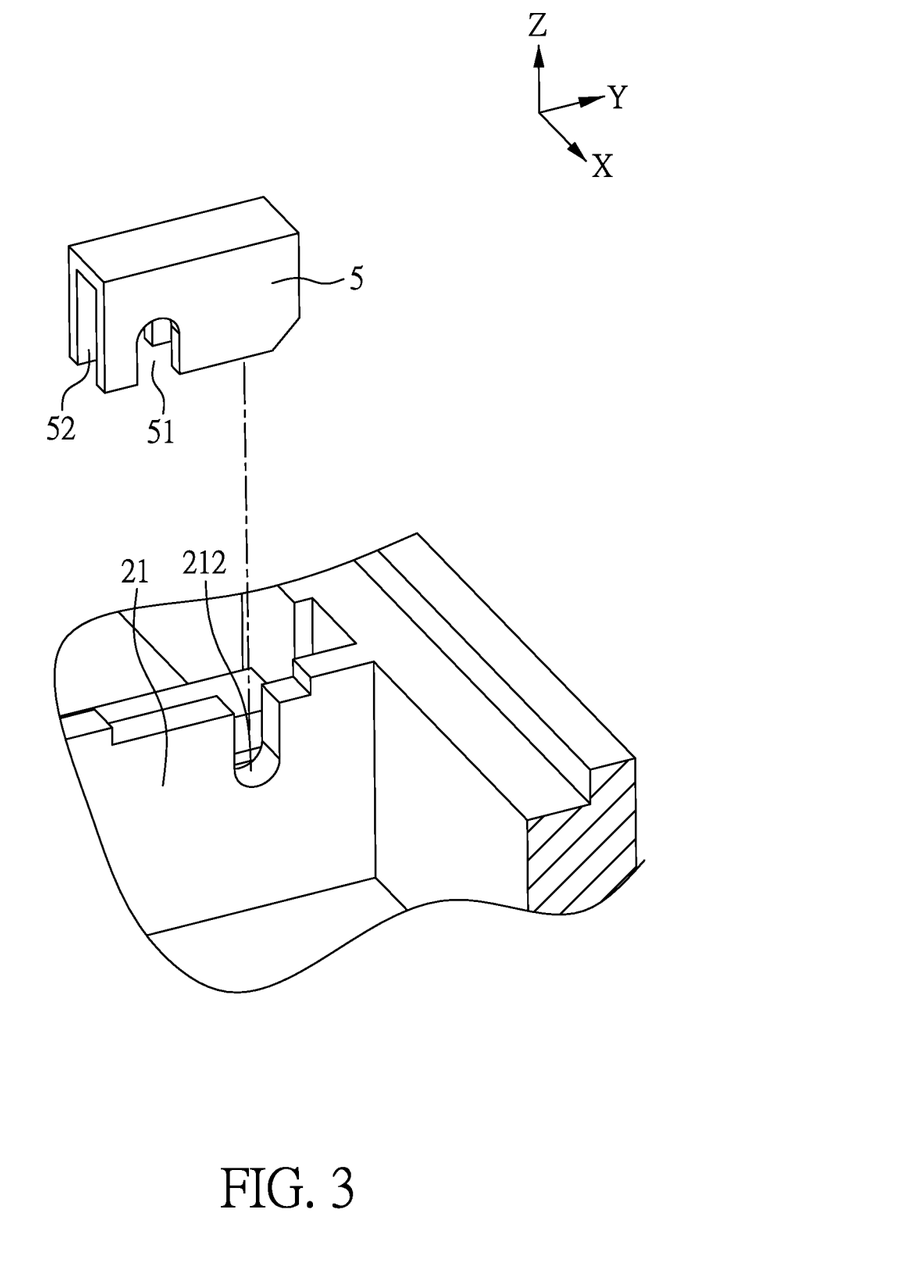
FIG. 3 is a schematic diagram of the second covering member in the wire blocking orientation according to an embodiment of the present disclosure.

FIG. 3 is a schematic diagram of the second covering member 5 in the second position, such as the wire blocking orientation, according to an embodiment of the present disclosure.

In the present disclosure, as shown in FIG. 1 and FIG. 3, the electronic device 100 may further include a second covering member 5 for detachably covering the first protrusion portion 21. More specifically, the second covering portion 5 has a second recess portion 52 through which the second covering member 5 may cover the first protrusion portion 21 so as to assemble the second covering member 5 on the first protrusion portion 21. The second covering member 5 may be provided with a first position and a second position. For example, the first position may be a wire passing orientation; that is, in the first position, a wire (e.g., the second wire 32) may pass through the second opening 51 of the second covering member 5. The second position may be a wire blocking orientation; that is, in the second position, no wire may pass through the second opening 51 of the second covering member 5. More specifically, the second covering member 5 has a second opening 51, and the first protrusion portion 21 has a second groove 212. In a first position, the second opening 51 of the second covering member 5 is in communication with the second groove 212 of the first protrusion portion 21 for allowing a second wire 32 to pass through. When the second covering member 5 is in the second position, for example, the wire blocking orientation, the second opening 51 of the second covering member 5 is not in communication with the second groove 212 of the first protrusion portion 21; that is, the second covering member 5 may block the second groove 212 of the first protrusion portion 21. At this moment, the wire may not pass through the second groove 212 of the first protrusion portion 21 and the second opening 51 of the second covering member 5. Therefore, water droplets or dust cannot enter the interior of the electronic device through the second groove 212 of the first protrusion portion 21, thereby avoiding damage to the electronic device.

In the present disclosure, the first covering member 4 and the second covering member 5 may be substantially the same, while the difference lies in the installation positions and orientations. The first covering member 4 in FIG. 1 and FIG. 2 is arranged corresponding to the first groove 211 of the first protrusion portion 21, and is arranged in the wire passing orientation for allowing the first wire 31 to pass through. The second covering portion 5 in FIG. 1 and FIG. 3 is arranged corresponding to the second groove 212 of the first protrusion portion 21, and is arranged in a wire blocking orientation through which no wire may pass. Therefore, the first opening 41 of the first covering member 4 may be similar to the second opening 51 of the second covering member 5, and the first recess portion 42 of the first covering member 4 may be similar to the second recess portion 52 of the second covering member 5, while a repeated description is deemed unnecessary.

Figure 4A:
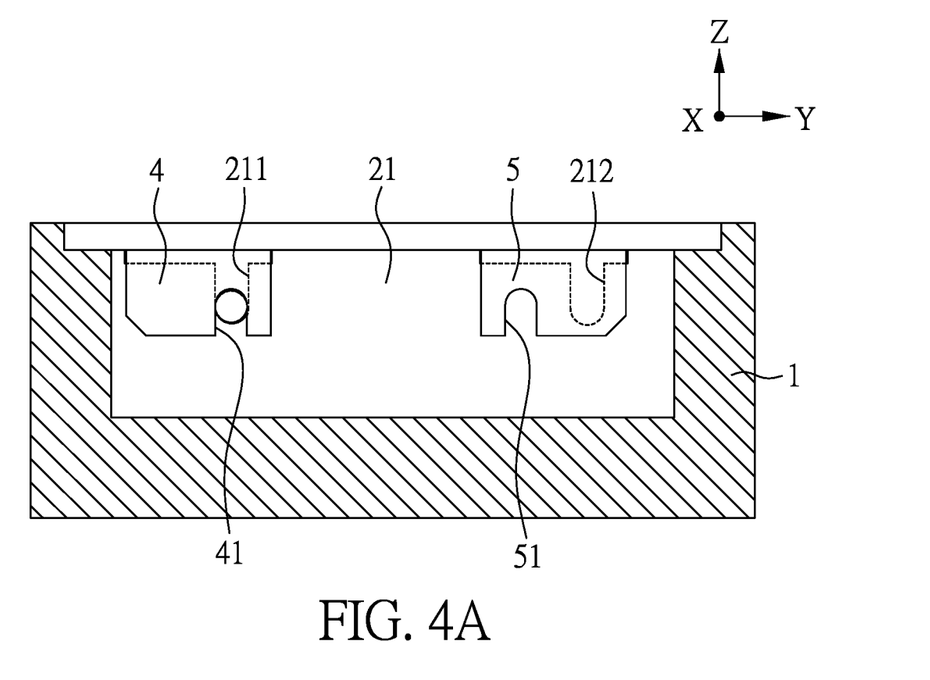
FIG. 4A is a side view of part of an electronic device according to an embodiment of the present disclosure.
Figure 4B:
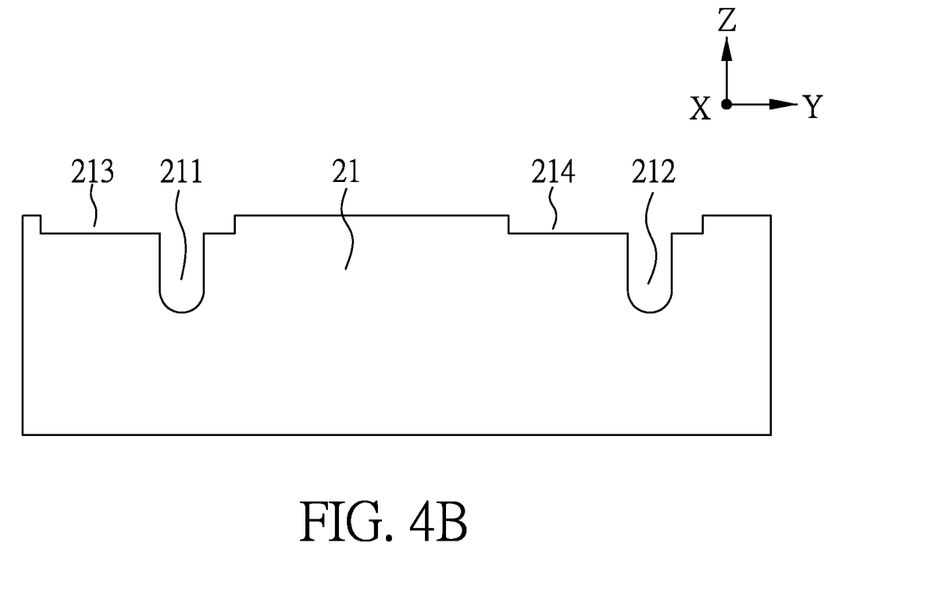
FIG. 4B is a side view of a first protrusion portion according to an embodiment of the present disclosure.

FIG. 4A is a side view of part of an electronic device according to an embodiment of the present disclosure, and FIG. 4B is a side view of a first protrusion portion 21 according to an embodiment of the present disclosure, wherein FIG. 4A and FIG. 4B are side views along the extending direction X of the first wire 31 in FIG. 1. For convenience of illustration, the first wire 31 is omitted in FIG. 4A.

In the present disclosure, as shown in FIG. 4A, when the first covering member 4 is arranged in the wire passing orientation, the first opening 41 of the first covering member 4 may be in communication with the first groove 211 of the first protrusion portion 21 and, when the second covering member 5 is arranged in the wire blocking orientation, the second opening 51 of the second covering member 5 may be not in communication with the second groove 212 of the first protrusion portion 21. Therefore, the first wire 31 (as shown in FIG. 1) may be electrically connected to the power or signal source outside the housing 1 through the first opening 41 of the first covering member 4 and the first groove 211 of the first protrusion portion 21. In addition, although not shown in the figures, in other aspects of the present disclosure, when the first covering member 4 is arranged in the wire blocking orientation, the first opening 41 of the first covering member 4 and the first groove 211 of the first protrusion portion 21 are not in communication and, when the second covering member 5 is arranged in the wire passing orientation, part of the second opening 51 of the second covering member 5 may be in communication with part of the second groove 212 of the first protrusion portion 21 for allowing the wire to pass through.

In addition, as shown in FIG. 4B, the first protrusion portion 21 further has a first sub-groove 213, wherein the first sub-groove 213 may be in communication with the first groove 211, and the first covering member 4 may be engaged in the first sub-groove 213 (as shown in FIG. 1 and FIG. 2). Similarly, the first protrusion portion 21 may further have a second sub-groove 214 that may be in communication with the second groove 212, and the second covering member 5 may be engaged in the second sub-groove 214 (as shown in FIG. 1 and FIG. 3). The first sub-groove 213 and the second sub-groove 214 may be provided with an alignment function, so as to prevent the first covering member 4 and/or the second covering member 5 from moving on the first protrusion portion 21 that may affect the protection effect. Therefore, during operation, when the first covering member 4 or the second covering member 5 are to be switched from the wire passing orientation to the wire blocking orientation, the first covering member 4 or the second covering member 5 may be rotated 180°, and then the first covering member 4 or the second covering member 5 are engaged in the corresponding sub-groove. Similarly, if the first covering member 4 or the second covering member 5 is to be switched from the wire blocking orientation to the wire passing orientation, similar operation may be applied and thus a repeated description is deemed unnecessary.

Figure 5:
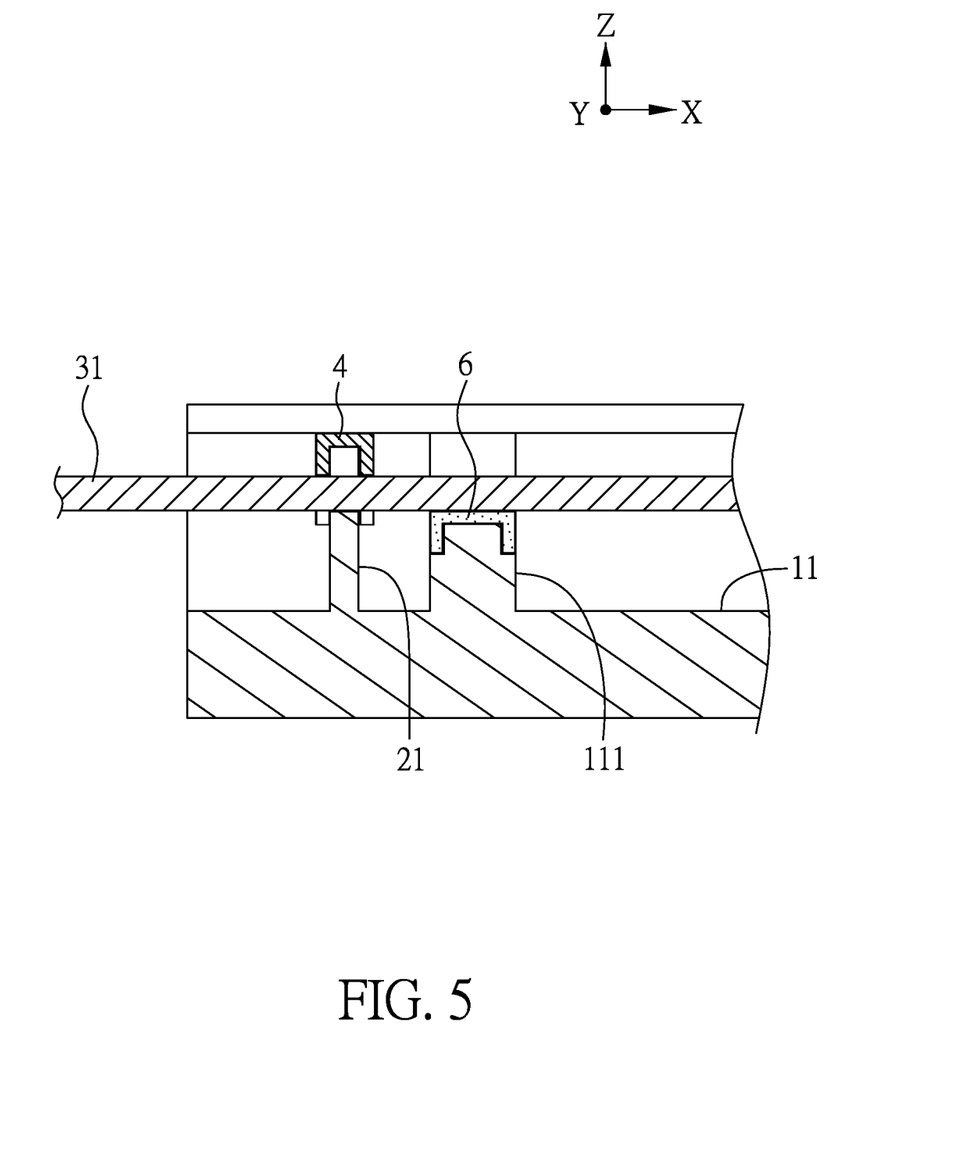
FIG. 5 is a cross-sectional view of part of the electronic device in FIG. 1.

FIG. 5 is a cross-sectional view of part of the electronic device in FIG. 1, wherein the cross-section in FIG. 5 is a cross-sectional view along the extending direction X of the first wire 31 in FIG. 1.

As shown in FIG. 5, the bottom portion 11 of the housing 1 further has a protruding part 111, and a water absorbing unit 6 may be arranged on the protruding part 111. The protruding part 111 may be used to fix the wire, and the water absorbing unit 6 may further improve the waterproof effect so as to prevent water droplets or moisture from entering the electronic device.

Figure 6A:
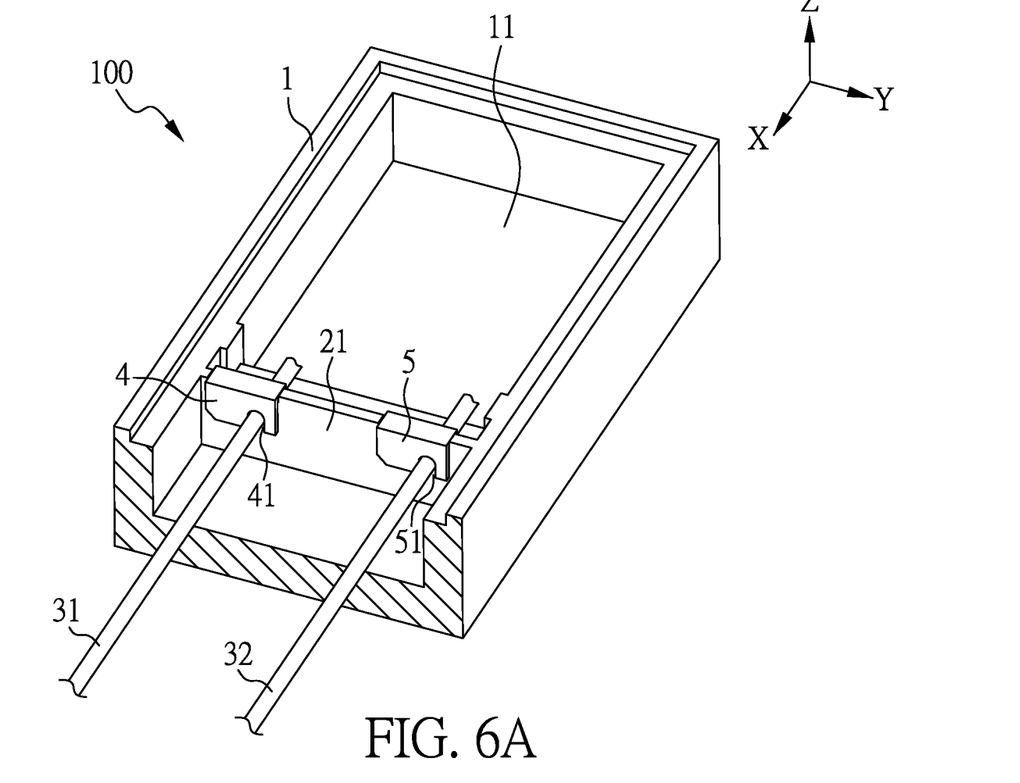
FIG. 6A is a three-dimensional schematic diagram of part of an electronic device according to an embodiment of the present disclosure.
Figure 6B:
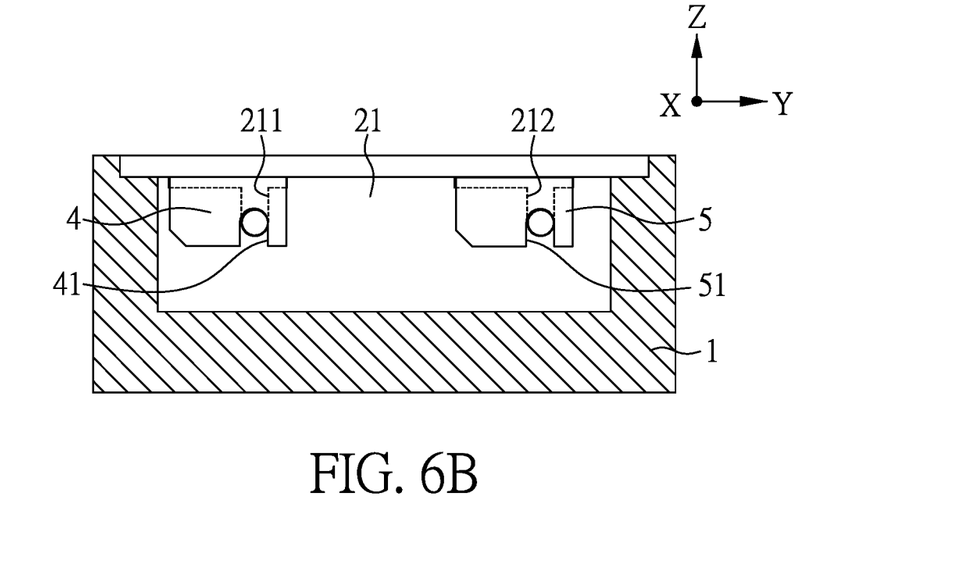
FIG. 6B is a side view of FIG. 6A.

FIG. 6A is a three-dimensional schematic diagram of part of an electronic device according to an embodiment of the present disclosure, and FIG. 6B is a side view of FIG. 6A, wherein FIG. 6B is a side view along the extending direction X of the first wire 31 in FIG. 6A and, for convenience of description, the first wire 31 and the second wire 32 are omitted in FIG. 6B. In addition, the electronic device of FIG. 6A is similar to that of FIG. 1, and the side view of FIG. 6B is similar to that of FIG. 4A, except for the following differences.

As shown in FIG. 6A and FIG. 6B, the second covering member 5 is arranged in the wire passing orientation, and thus part of the second opening 51 of the second covering member 5 may be in communication with part of the second groove 212 of the first protrusion portion 21. More specifically, when the second covering member 5 is in the wire passing orientation, a second wire 32 may pass through the second opening 51 and the second groove 212 to be electrically connected to the power source or signal source outside the housing 1.

In addition, although not shown in the figures, in other aspects of the present disclosure, the electronic device may further include a plurality of covering members, and the first protrusion portion 21 may further include a plurality of grooves, so that the plurality of wires (such as the first wire 31, the second wire 32, the third wire, . . . , the N-th wire) may respectively pass through corresponding openings and grooves for being electrically connected to the power source or signal source outside the housing 1.

Figure 7:
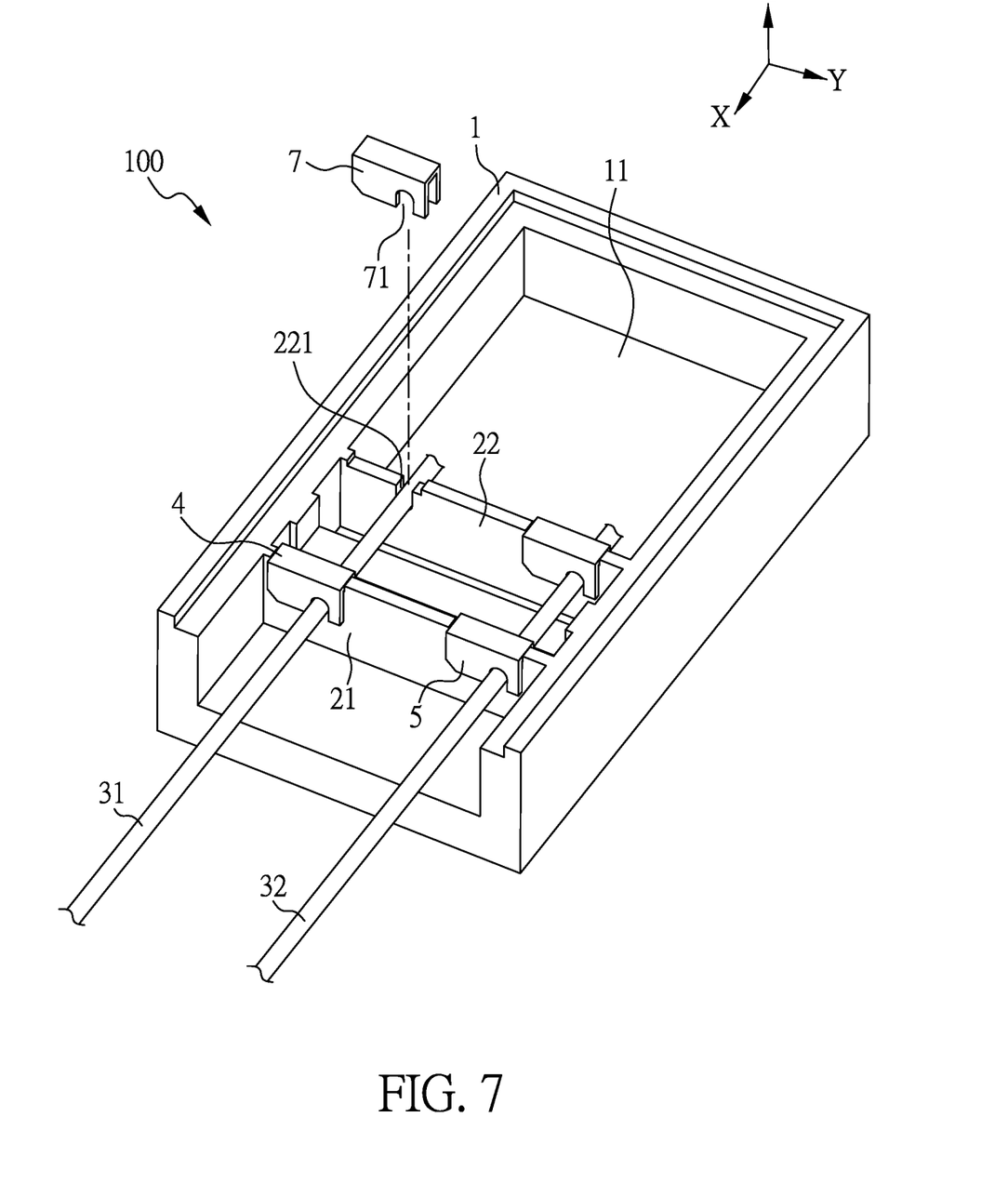
FIG. 7 is a three-dimensional schematic diagram of part of an electronic device according to an embodiment of the present disclosure.

FIG. 7 is a three-dimensional schematic diagram of part of an electronic device according to an embodiment of the present disclosure, wherein the side view of FIG. 7 is substantially the same as the side view of the embodiment shown in FIG. 6B. The electronic device of FIG. 7 is similar to that of FIG. 6A and FIG. 6B except for the following differences.

As shown in FIG. 7, the electronic device of the present disclosure may further include: a second protrusion portion 22 arranged on the bottom 11 of the housing 1 and opposite to the first protrusion portion 21, wherein the second protrusion portion 22 has a third groove 221, and the third groove 221 is used for allowing the first wire 31 to pass through; and a third covering member 7 for covering the second protrusion portion 22, wherein the third covering member 7 has a third opening 71. According to some embodiments, the third opening 71 of the third covering member 7 may be used for allowing the first wire 31 to pass through. When the third covering member 7 is in the wire passing orientation, the third opening 71 of the third covering member 7 may be in communication with the third groove 221 of the second protrusion portion 22. Therefore, as shown in FIG. 7, the third groove 221 of the second protrusion portion 22 and the third opening 71 of the third covering member 7 may be used for allowing the first wire 31 to pass through. As a result, the first wire 31 may pass through the first opening 41 of the first covering member 4 (as shown in FIG. 6B), the first groove 211 of the first protrusion portion 21 (as shown in FIG. 6B), the third opening 71 of the third covering member 7 and the third groove 221 of the second protrusion portion 22, so that the power source or signal source outside the housing 1 may be electrically connected to the internal components of the electronic device through the first wire 31. With the arrangement of the second protrusion portion 22 and the third covering member 7, the waterproof or dustproof effect may be further improved.

In this embodiment, the second protrusion portion 22 may be substantially the same as the first protrusion portion 21, and thus a repeated description is deemed unnecessary. In this embodiment, the third covering member 7 may be substantially the same as the first covering member 4 or the second covering member 5, while the difference lies in the installation position and/or the installation orientation, and thus a repeated description is deemed unnecessary. Therefore, the third opening 71 of the third covering member 7 may be similar to the first opening 41 of the first covering member 4 and/or the second opening 51 of the second covering member 5, so that a repeated description is deemed unnecessary.

Figure 8A:
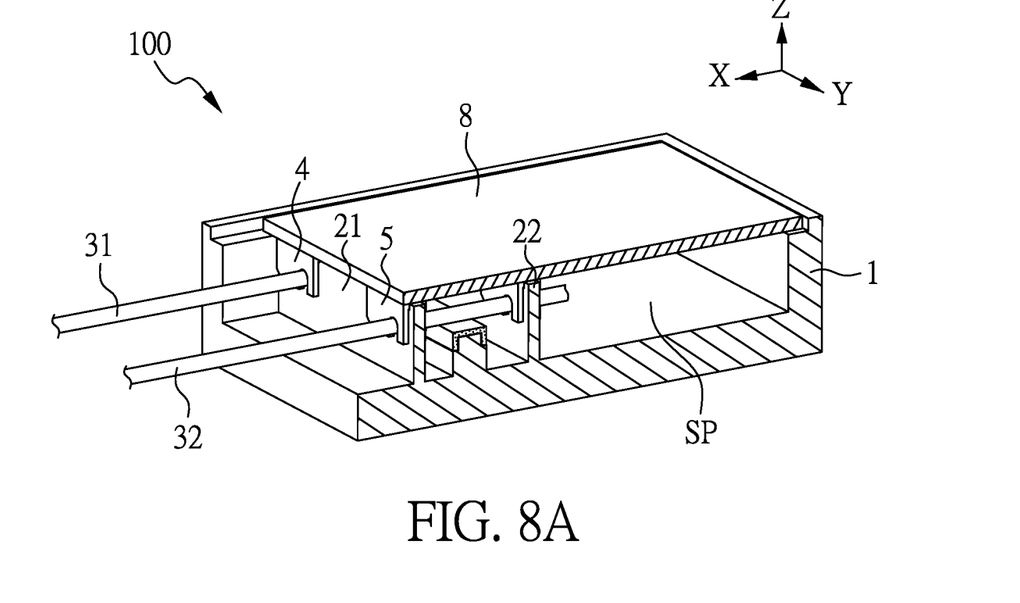
FIG. 8A is a three-dimensional schematic diagram of part of an electronic device according to an embodiment of the present disclosure.

FIG. 8A is a three-dimensional schematic diagram of part of an electronic device according to an embodiment of the present disclosure.

As shown in FIG. 8A, the electronic device of the present disclosure may further include an upper lid 8. When the upper lid 8 covers the housing 1, the upper lid 8 may be in contact with the upper surface of the first protrusion portion 21 and the upper surface of the first covering member 4, so as to form an enclosed space SP by the upper lid 8, the housing 1, the first protrusion portion 21 and the first covering member 4, such that the wires (such as the first wire 31 and/or the second wire 32) may be placed inside the hermetical enclosed space SP, and water droplets or dust outside the housing 1 cannot enter into the enclosed space SP, so as to achieve the effect of protecting the electronic device.

In addition, although the arrangement structure inside the housing 1 in FIG. 8A is that shown in FIG. 7, in the present disclosure, the arrangement structure inside the housing 1 may also be that shown in FIG. 1 to FIG. 6B, and thus a repeated description is deemed unnecessary.

Figure 8B:
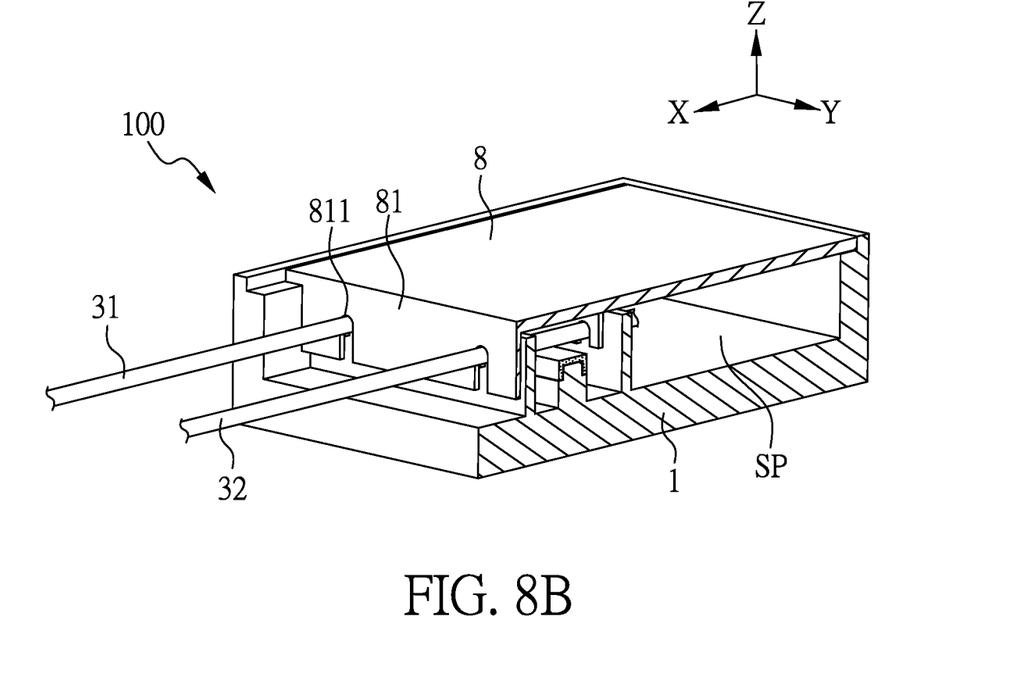
FIG. 8B is a three-dimensional schematic diagram of part of an electronic device according to an embodiment of the present disclosure.

FIG. 8B is a three-dimensional schematic diagram of part of the electronic device according to an embodiment of the present disclosure, wherein FIG. 8B is similar to FIG. 8A except for the following differences.

In the present disclosure, as shown in FIG. 8B, the upper lid 8 may have a side wall 81, and the side wall 81 has an opening 811. When the first covering member 4 (as shown in FIG. 7 and FIG. 6B) is in the first position (e.g., the wire passing orientation), the opening 811 of the side wall 81 is in communication with the first opening 41 of the first covering member 4 (as shown in FIG. 6B) and the first groove 211 of the first protrusion portion 21 (as shown in FIG. 6B). Therefore, as shown in FIG. 6B, FIG. 7 and FIG. 8B, the first wire 31 may pass through the opening 811 of the side wall 81 of the upper lid 8, the first opening 41 of the first covering member 4 and the first groove 211 of the first protrusion portion 21, so that the power source or signal source outside the housing 1 may be electrically connected to the internal components of the electronic device through the first wire 31.

Although the arrangement structure in the housing 1 in FIG. 8B is that shown in FIG. 7, in the present disclosure, the arrangement structure in the housing 1 may also be that shown in FIG. 1 to FIG. 6B. Therefore, in other aspects of the present disclosure, the side wall 81 of the upper lid 8 may include a plurality of openings, and the first wire 31, the second wire 32, etc. may pass through the plurality of openings of the side wall correspondingly, so that the power source or signal source outside the housing 1 may be electrically connected to the internal components of the electronic device through the first wire 31, the second wire 32, etc., respectively.

Waterproof Test

After covering the housing with the upper lid, the front and back of the housing is showered with water flow of 220 cm3/s for 5 minutes. Afterwards, the upper lid is opened to check whether there is water in the housing so as to determine the waterproof effect.

The electronic device shown in FIG. 7 and FIG. 8B is used to perform a waterproof test. After showering the front and back of the electronic device with a water flow of 220 cm3/s for 5 minutes, the upper lid is opened to observe that no water flowed into the housing, which proves that the electronic device of the present disclosure has a waterproof effect at the wire outlet.

Dustproof Test

After covering the housing with the upper lid, the housing is placed into a dust tester and the dust tester (particle size (um) Class11:1.6~2.3; particle density (g/cm3):2.9~3.1 dust tester) is started. After 2 hours, the housing is moved out, and the upper lid is opened to check whether there is any sign of dust inside the housing so as to determine the dustproof effect.

The electronic device shown in FIG. 7 and FIG. 8B is used to perform the dustproof test. After placing the housing into the dust tester for 2 hours, the housing is moved out and the upper lid is opened for inspection. It is observed that no dust has entered the housing, which proves that the electronic device of the present disclosure has a dust-proof effect at the wire outlet.

In summary, according to some embodiments, the electronic device 100 includes the first protrusion portion 21 and the first covering member 4 detachably covering the first protrusion portion 21. The first protrusion portion 21 has a first groove 211, and the first covering member 4 has a first opening 41 for allowing the wire to pass through. The position of the first covering member 4 may be adjusted according to requirements. When the first covering member is in the first position of, the wire may pass through the first opening of the first covering member 4. When the first covering member is in the second position, the first covering member 4 may close the first groove 211 of the first protrusion portion 21, so as to prevent water droplets or dust from entering the electronic device through the first groove 211 of the first protrusion portion 21, thereby reducing the risk of damage to electronic devices.

The aforementioned specific embodiments should be construed as merely illustrative, and not limiting the rest of the present disclosure in any way.

The invention claimed is:
1. An electronic device, comprising:
a housing having a bottom portion;
a first protrusion portion arranged on the bottom portion of the housing, the first protrusion portion having a first groove; and
a first covering member for detachably covering the first protrusion portion, the first covering member having a first opening;
wherein when the first covering member covers the first protrusion portion in a first position, the first opening of the first covering member is in communication with the first groove of the first protrusion portion, and a first wire can pass through the first opening of the first covering member and the first groove of the first protrusion portion, and
wherein when the first covering member covers the first protrusion portion in a second position, the first opening of the first covering member is not in communication with the first groove of the first protrusion portion, and no wire can pass through the first opening of the first covering member and the first groove of the first protrusion portion.

2. The electronic device as claimed in claim 1, wherein the first covering member further has a first recess portion, and the first covering member covers the first protrusion portion through the first recess portion.

3. The electronic device as claimed in claim 1, wherein an extending direction of the first opening of the first covering member is the same as an extending direction of the first wire.

4. The electronic device as claimed in claim 3, wherein the first opening of the first covering member passes through the first covering member in parallel to an extending direction of the first wire.

5. The electronic device as claimed in claim 1, further comprising a second covering member for detachably covering the first protrusion portion, wherein the second covering member has a second opening, the first protrusion portion has a second groove and, wherein when the second covering member covers the first protrusion portion in the first position, the second opening of the second covering member is in communication with the second groove of the first protrusion portion, and a second wire can pass through the second opening of the second covering member and the second groove of the first protrusion portion.

6. The electronic device as claimed in claim 5, wherein the first protrusion portion has a first sub-groove in communication with the first groove, and the first covering member is engaged in the first sub-groove.

7. The electronic device as claimed in claim 6, wherein the first protrusion portion further has a second sub-groove in communication with the second groove, and the second covering member is engaged in the second sub-groove.

8. The electronic device as claimed in claim 5, wherein, when the second covering member is in a second position, the second opening of the second covering member and the second groove of the first protrusion portion are not in communication.

9. The electronic device as claimed in claim 1, further comprising a second covering member for detachably covering the first protrusion portion, wherein the second covering member further has a second recess portion, and the second covering member covers the first protrusion portion through the second recess portion.

10. The electronic device as claimed in claim 1, wherein the first protrusion portion further has a first sub-groove, the first sub-groove has a first sidewall, and the first covering member has a second sidewall, wherein when the first covering member covers the first protrusion portion in the first position, the first sidewall of the first sub-groove is aligned with the second sidewall of the first protrusion portion, and the first covering member is engaged in the first sub-groove.

11. The electronic device as claimed in claim 1, further comprising:
a second protrusion portion arranged on the bottom of the housing and opposite to the first protrusion portion, the second protrusion portion having a third groove; and
a third covering member for covering the second protrusion portion, the third covering member having a third opening,
wherein the third groove of the second protrusion portion and the third opening of the third covering member are used for allowing the first wire to pass through.

12. The electronic device as claimed in claim 1, further comprising an upper lid for covering the housing, wherein the upper lid has a side wall provided with an opening and, when the first covering member is in the first position, the opening of the side wall is in communication with the first opening of the first covering member and the first groove of the first protrusion portion.

13. The electronic device as claimed in claim 12, wherein the upper lid is in contact with an upper surface of the first protrusion portion and an upper surface of the first covering member.

14. The electronic device as claimed in claim 1, wherein the housing further has a protruding part arranged on the bottom portion, and the protruding part protrudes away from the bottom portion.

15. The electronic device as claimed in claim 14, further comprising a water absorbing unit arranged on the protruding part, wherein when the first covering member covers the first protrusion portion in the first position, the first wire passes through the first opening of the first covering member and the first groove of the first protrusion portion, and the water absorbing unit is disposed between the protruding part of the housing and the first wire.

16. The electronic device as claimed in claim 1, wherein the first opening is a non-closed opening.

17. The electronic device as claimed in claim 16, wherein an opening direction of the first opening faces the bottom portion of the housing.

18. The electronic device as claimed in claim 1, wherein the first wire is fixed in the first groove of the first protrusion portion through the first covering member.

* * * * *